United States Patent
Lim et al.

(10) Patent No.: US 10,637,430 B2
(45) Date of Patent: Apr. 28, 2020

(54) BULK ACOUSTIC WAVE FILTER DEVICE AND METHOD OF MANUFACTURING THE SAME

(71) Applicant: Samsung Electro-Mechanics Co., Ltd., Suwon-si (KR)

(72) Inventors: Chang Hyun Lim, Suwon-si (KR); Moon Chul Lee, Suwon-si (KR); Won Han, Suwon-si (KR); Tae Kyung Lee, Suwon-si (KR); Dae Ho Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 323 days.

(21) Appl. No.: 15/621,552

(22) Filed: Jun. 13, 2017

(65) Prior Publication Data
US 2018/0013397 A1    Jan. 11, 2018

(30) Foreign Application Priority Data

Jul. 7, 2016    (KR) .................. 10-2016-0085999
Nov. 28, 2016   (KR) .................. 10-2016-0159241

(51) Int. Cl.
*H03H 9/15*    (2006.01)
*H03H 9/02*    (2006.01)
*H03H 9/17*    (2006.01)
*H03H 3/02*    (2006.01)
*H03H 9/10*    (2006.01)

(52) U.S. Cl.
CPC .......... *H03H 9/02015* (2013.01); *H03H 3/02* (2013.01); *H03H 9/02047* (2013.01); *H03H 9/02118* (2013.01); *H03H 9/1007* (2013.01); *H03H 9/171* (2013.01); *H03H 9/173* (2013.01); *H03H 2003/021* (2013.01)

(58) Field of Classification Search
CPC .. H03H 9/02015; H03H 3/02; H03H 9/02047; H03H 9/1007; H03H 9/171
USPC .......... 310/348–353, 363–366; 333/186–193
See application file for complete search history.

(56) References Cited

U.S. PATENT DOCUMENTS

| | | | |
|---|---|---|---|
| 6,215,375 B1 | 4/2001 | Larson, III et al. | |
| 6,693,500 B2 | 2/2004 | Yang et al. | |
| 6,812,619 B1 | 11/2004 | Kaitila et al. | |
| 7,602,102 B1 * | 10/2009 | Barber | H03H 3/02 310/320 |
| 2002/0121944 A1 | 9/2002 | Larson, III et al. | |
| 2004/0189423 A1 | 9/2004 | Loebl et al. | |

(Continued)

FOREIGN PATENT DOCUMENTS

| | | |
|---|---|---|
| JP | 2002-359539 A | 12/2002 |
| JP | 2006-121357 A | 5/2006 |

*Primary Examiner* — Thomas M Dougherty
(74) *Attorney, Agent, or Firm* — NSIP Law

(57) ABSTRACT

A bulk acoustic wave filter device includes a substrate, a lower electrode on the substrate, a piezoelectric layer covering at least a portion of the lower electrode, and an upper electrode covering at least a portion of the piezoelectric layer. The upper electrode has a density reduction layer disposed on at least a portion thereof, except a central portion of a resonance region of the bulk acoustic wave filter device that deforms and vibrates with the piezoelectric layer during activation of the piezoelectric layer. The density reduction layer has a density lower than a density of other portions of the upper electrode.

21 Claims, 4 Drawing Sheets

(56) References Cited

U.S. PATENT DOCUMENTS

2014/0118088 A1* 5/2014 Burak ............... H03H 9/02118
333/187

* cited by examiner

BULK ACOUSTIC WAVE FILTER DEVICE AND METHOD OF MANUFACTURING THE SAME

CROSS-REFERENCE TO RELATED APPLICATION(S)

This application claims the benefit under 35 USC 119(a) of Korean Patent Application Nos. 10-2016-0085999, filed on Jul. 7, 2016 and 10-2016-0159241, filed on Nov. 28, 2016 in the Korean Intellectual Property Office, the entire disclosures of which are incorporated herein by reference for all purposes.

BACKGROUND

1. Field

The following description relates to a bulk acoustic wave filter device and a method of manufacturing the same.

2. Description of Related Art

Bulk acoustic wave resonator (BAWR) devices refer to thin film type elements generating resonance using piezoelectric characteristics of a piezoelectric dielectric material. For example, piezoelectric dielectric materials may be deposited on semiconductor substrates, such as silicon wafers. A bulk acoustic wave filter device is demonstrated when such thin film type elements with the BAWR configuration are implemented as a filter.

While the induced longitudinal waves are formed in the direction of the applied electric field, spurious resonances or vibration components of lateral waves, which are orthogonal to the longitudinal waves, appear in, and thus affect, the resonant frequency and peripheral frequency domains of corresponding bulk acoustic wave filter devices, with the lateral wave components of the vibration causing spurious resonances in the planar direction of the bulk acoustic wave filter device.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

In one aspect there is provided a bulk acoustic wave filter device including a substrate, a lower electrode on the substrate, a piezoelectric layer covering at least a portion of the lower electrode, and an upper electrode covering at least a portion of the piezoelectric layer, wherein the upper electrode has a density reduction layer disposed on at least a portion of the upper electrode, except a central portion of a resonance region of the bulk acoustic wave filter device that deforms and vibrates with the piezoelectric during activation of the piezoelectric layer, the density reduction layer having a density lower than a density of other portions of the upper electrode.

The density reduction layer may include an oxide.

The upper electrode may include a conductor, where the density reduction layer may be a result of a select oxidation of the conductor of the upper electrode.

The upper electrode may have an electrode layer covering the piezoelectric layer and a frame layer stacked on the electrode layer, and the density reduction layer may be formed on a portion of the electrode layer disposed between the frame layer and an inner area of the electrode layer corresponding to the resonance region.

The density reduction layer formed on the portion of the electrode layer may have a band shape outside a circumference of the inner area and inside an inner circumference of the frame layer.

The frame layer may have a thickness that is greater than a thickness of the electrode layer.

The upper electrode may have an electrode layer covering the piezoelectric layer and a frame layer stacked on the electrode layer, and the density reduction layer may be formed on the frame layer and between the frame layer and an inner area of the electrode layer.

The frame layer may have a band shape outside a circumference of the inner area.

The bulk acoustic wave filter device may further include a first layer forming an air gap together with the substrate, and a second layer formed on the first layer so as to be disposed on the air gap below the lower electrode.

The bulk acoustic wave filter device may further include a first metal pad formed on the upper electrode and a second metal pad formed on the lower electrode, and a passivation layer formed in all portions of the bulk acoustic wave filter, except portions of the bulk acoustic wave filter in which the metal pads are formed.

The upper electrode may include any one of molybdenum (Mo), ruthenium (Ru), tungsten (W), iridium (Ir), and platinum (Pt), or an alloy of at least two of molybdenum (Mo), ruthenium (Ru), tungsten (W), iridium (Ir), and platinum (Pt).

The bulk acoustic wave filter device may further include an air gap formation layer formed on the substrate, the air gap formation layer having an air gap therein, and a first protection layer formed on the air gap formation layer and disposed below the lower electrode.

In one general aspect, there is provided a method of manufacturing a bulk acoustic wave filter device, the method including forming layers of the bulk acoustic wave filter device, including a sacrificial layer, a lower electrode layer, a piezoelectric layer, and an upper electrode layer, forming a photoresist to expose the upper electrode except a central portion of the upper electrode, forming a density reduction layer by oxidizing a portion of the upper electrode exposed externally from the formed photoresist, and removing the photoresist.

To form the upper electrode layer, the method may further include forming an electrode layer covering the piezoelectric layer and forming a frame layer stacked on the electrode layer, where the density reduction layer may be formed on a select portion of the electrode layer disposed between the frame layer and an inner portion of the electrode layer.

To form the upper electrode layer, the method may further include forming an electrode layer covering the piezoelectric layer and forming a frame layer stacked on the electrode layer, where the density reduction layer is formed on the frame layer and on a select portion of the electrode layer disposed between the frame layer and an inner portion of the electrode layer.

The upper electrode may include any one of molybdenum (Mo), ruthenium (Ru), tungsten (W), iridium (Ir), and platinum (Pt), or an alloy of at least two of molybdenum (Mo), ruthenium (Ru), tungsten (W), iridium (Ir), and platinum (Pt).

The forming of the density reduction layer may include performing an ashing process to oxidize a conductor in the portion of the upper electrode.

In one general aspect, there is provided a film bulk acoustic wave resonator including a substrate including or supporting a cavity, a first electrode above the cavity, a piezoelectric layer above the cavity, a second electrode above the cavity, a frame above the first electrode at an outer circumference of a resonance region represented by at least a portion of the first electrode, a portion of the piezoelectric layer, and a portion of the second electrode, and a low density element above the first electrode within an inner circumference of the frame and outside of an inner region of the resonance region, the frame and the low density element being configured to suppress spurious resonances other than a longitudinal resonance produced in the resonance region.

The low density element may be configured to suppress lateral wave excitation in the resonance region.

The low density element may have a density less than a density of the first electrode.

The low density element may be an oxide of a conductor of the first electrode and formed from the first electrode.

The piezoelectric may include Aluminum nitride (AlN).

In one general aspect, there is provided a film bulk acoustic wave resonator including a substrate including or supporting a cavity, a first electrode above the cavity, a piezoelectric layer above the cavity, second electrode above the cavity, and a low density element above the first electrode arranged with respect to an circumference of a resonance region, represented by at least a portion of the first electrode, a portion of the piezoelectric layer, a portion of and the second electrodes, and outside of an inner region of the resonance region, with the low density element being configured to suppress lateral wave excitation in the resonance region.

The low density element may have a density less than the first electrode.

The low density element may be an oxide of a conductor of the first electrode, and is formed from the first electrode to have a density lower than the conductor.

The low density element may have a thickness less than a total remaining aligned thickness of the resonance region and greater than a thickness of the electrode layer.

The cavity may be formed between portions of a gap formation layer formed on the substrate, so as to be formed above the substrate.

Other features and aspects will be apparent from the following detailed description, the drawings, and the claims.

BRIEF DESCRIPTION OF DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
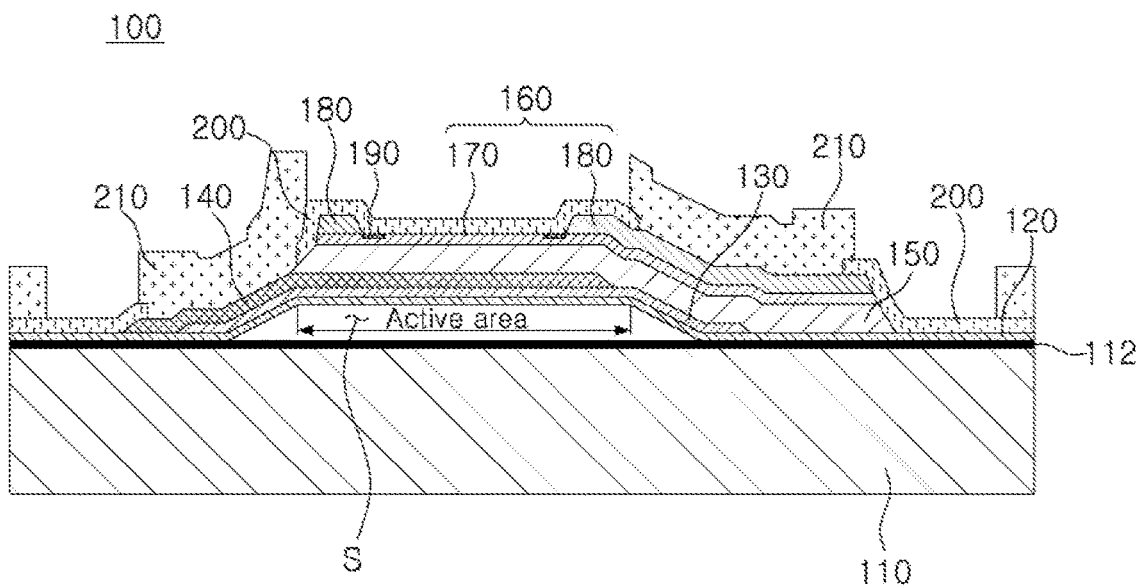
FIG. 1 is a cross-sectional view illustrating a bulk acoustic wave filter device according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

It should also be appreciated that references throughout this specification to an example, one example, an embodiment, one embodiment, or one or more embodiments, as only examples, or references to features that may be included in one or more of such embodiments, mean that the particular feature(s), structure(s), or characteristic(s) described in connection with the examples or embodiments are features that are included in at least one embodiment of the disclosure. Therefore, it should be appreciated that two or more references to an example, an alternative example, an embodiment, one embodiment, one or more embodiments, an alternative embodiment, or features that may be included in such one or more examples or embodiments, in various portions of this specification, are not necessarily referring to the same example or embodiment, though the disclosure supports such a reference. Furthermore, the particular features, structures or characteristics may be combined as suitable in one or more embodiments of the disclosure. For example, if a feature is referred to in that it may be included in an example or embodiment, then the feature may additionally be included in any or all of the other embodiments. Likewise, while particular feature(s), structure(s), or characteristic(s) described in connection with an example or embodiment may be discussed with respect to an example or embodiment, it should also be appreciated that unless specifically stated, or clearly indicated through context, such feature(s), structure(s), or characteristic(s) are not required of all embodiments.

Due to manufacturing techniques and/or tolerances, variations of the shapes shown in the drawings may occur. Thus, the examples described herein are not limited to the specific shapes shown in the drawings, but include changes in shape that occur during manufacturing.

Unless otherwise defined, all terms including technical and scientific terms used herein have the same meaning as commonly understood by one of ordinary skill in the art to which this disclosure pertains consistent with and after an understanding of the present disclosure. It will be further understood that terms, such as those defined in commonly-used dictionaries, should be interpreted as having a meaning that is consistent with their meaning in the context of the relevant art and the present disclosure and will not be interpreted in an idealized or overly formal sense unless expressly so defined herein.

Bulk acoustic wave resonators use generated piezoelectric generated longitudinal waves to transduce applied electric fields. For example, bulk acoustic wave filters may propagate longitudinal waves, corresponding to vertical waves with the configuration of FIG. 1, in response to applied RF signals. However, lateral waves (e.g., orthogonal to the longitudinal waves and corresponding to horizontal waves with respect to the configuration of FIG. 1) may also be excited in this process, with vibration components as spurious resonances of the lateral waves appearing in the resonant frequency and peripheral frequency domains of the corresponding bulk acoustic wave filter devices. Accordingly, it is found that such a lateral vibration resonance phenomenon may lead to undesirable spurious resonances noise within the pass band of the bulk acoustic wave filter device, and may result in a reduced quality coefficient value (Q factor). Accordingly, it may be desirable to reduce spurious resonances or noise due to the vibration of the lateral waves to secure uniform and low insertion loss characteristics in the pass band of the bulk acoustic wave filter device while also providing a high Q factor and coupling coefficient. In one or more embodiments, for example, a bulk acoustic wave filter may be provided with reduced spurious resonances and noise from the lateral waves while also having a high Q factor and coupling coefficient.

FIG. 1 is a cross-sectional view illustrating a bulk acoustic wave filter device according to one or more embodiments.

Referring to FIG. 1, the bulk acoustic wave filter device includes an air gap S, a substrate 110, a first layer 120, a second layer 130, a lower electrode 140, a piezoelectric layer 150, an upper electrode 160, an electrode layer 170, frame layers 180, density reduction layers 190, a passivation layer 200, and metal pads 210, for example.

The substrate 110 may be a substrate on which silicon (Si) is laminated, for example. In an example, a silicon wafer may be used as the substrate. A protection layer 112 may be formed on an upper surface of the substrate 110, such as to protect the silicon (Si) during a removal process of a sacrificial layer, such as the sacrificial layer 200 of FIG. 3, used to form the air gap S, for example, a cavity. For example, as discussed below, the protection layer 112 may prevent etching of the substrate 110 during such a removal process.

The first layer 120 is disposed on the substrate 110 and the air gap S, for example, a cavity. For example, as discussed below, the first layer 120 may be formed on the substrate 110 and the example sacrificial layer to cover the sacrificial layer formed on the substrate 110. Subsequently, when the sacrificial layer is removed, the air gap S is formed below the first layer 120. With air gap S, the bulk acoustic wave filter 100 is a film bulk acoustic wave filter, though embodiments are not limited thereto.

As only an example, the first layer 120 may include silicon oxide ($SiO_2$) or a material containing the same. The first layer 120 may also help prevent etching of a lower side portion of the lower electrode 140 during the example removal process of the sacrificial layer.

The second layer 130 is formed on the first layer 120 so as to also be disposed above the air gap S. As only an example, the second layer 130 may include silicon nitride (SiN) or a material containing the same. The second layer 130 compensates for structural stresses of the bulk acoustic wave filter device to help structurally support the portions of the bulk acoustic wave filter device corresponding to a resonant area (hereinafter also referred to as an "active area"), and help reduce deformation of structures disposed in the active area due to such structural stresses.

Here, the active area refers to an area vibrated while being deformed along with the piezoelectric layer 150 when deformation of the piezoelectric layer 150 is induced, as illustrated in FIG. 1. For example, the active area will be considered to include at least the overlapping portions the piezoelectric layer 150, the lower electrode 140, and the upper electrode 160 vertically aligned with the illustrated extents of the active area and which vibrate with the deformation of the piezoelectric layer 150.

The lower electrode 140 is formed on the second layer 130. As a non-limiting example, the lower electrode 140 may be composed of or include a conductive material such as molybdenum (Mo), ruthenium (Ru), tungsten (W), iridium (Ir), or platinum (Pt), or alloys thereof.

The lower electrode 140 may also be used as an input electrode inputting an electrical signal, such as a radio frequency (RF) signal, to the piezoelectric layer 150, or as an output electrode. For example, when the lower electrode 140 is the input electrode, the upper electrode 160 may be the output electrode, or when the lower electrode 140 is the output electrode, the upper electrode 160 may be the input electrode.

Accordingly, the piezoelectric layer 150 covers at least a portion of the lower electrode 140 and converts the electrical signal input from the lower electrode 140 or the upper electrode 160 into acoustic waves.

As an example, when an electric field that changes over time is induced in the upper electrode 160, the piezoelectric layer 150 may convert the electrical signal input from the upper electrode 160 into physical vibrations which manifest as acoustic waves in the active area. Accordingly, it can be considered that changes in the electric field over time by the upper electrode 160 may be induced by the piezoelectric layer 150 as primarily in the thickness direction (illustrated vertical direction) longitudinal acoustic waves. At the transition between the lower electrode 140 and the piezoelectric layer 150, the acoustic waves are converted by the piezoelectric layer 150 to corresponding electric field changes at the lower electrode 140. Here, the piezoelectric layer 150 generates bulk acoustic longitudinal waves in the thickness direction of the piezoelectric layer 150 in the piezoelectric layer 150, due to the induced electric field.

As described above, the piezoelectric layer 150 generates the bulk acoustic waves that represent the electrical signal as acoustic waves.

The piezoelectric layer 150 is formed of aluminum nitride (AlN), zinc oxide (ZnO), or lead zirconate titanate, for example, such as by depositing aluminum nitride, zinc oxide, or lead zirconate titanate on the lower electrode 140. When the piezoelectric layer 150 is made of aluminum nitride (AlN), the piezoelectric layer 150 may further include a rare earth metal. For example, the rare earth metal may include at least one of scandium (Sc), erbium (Er), yttrium (Y), and lanthanum (La).

The upper electrode 160 covers at least a portion of the piezoelectric layer 150. As an example, the upper electrode 160 may have an electrode layer 170 covering the piezoelectric layer 150 and have the frame layers 180 formed on the electrode layer 170.

The thickness of each of the frame layers 180 may be greater than that of the electrode layer 170, noting that there may also be only a single frame layer 180 configured as illustrated in FIG. 1 and that bands the bulk acoustic wave filter 100. For example, the respective frame layer 180 may have a thickness greater than a corresponding portion of the electrode layer vertically aligned with the frame layer 180. The frame layer 180 is formed on the electrode layer 170 so as to be disposed in a portion of the bulk acoustic wave filter device 100 outside of a central portion of the active area. In other words, the frame layer 180 is configured in the portion of the bulk acoustic wave filter device 100 so that at least both a portion of the frame layer 180 and a portion of the electrode layer 170 are externally disposed during a manufacturing process of the bulk acoustic wave filter device 100.

As an example, the frame layer 180 may be formed of the same material as the electrode layer 170. However, the frame layer 180 is not limited thereto, and may be formed of a material different from that of the electrode layer 170.

The frame layer 180 reflects lateral waves that may be generated at the time of resonance to an inner portion of the active area, thus trapping resonant energy in the active area. In other words, the frame layer 180 is formed on an outer portion of the electrode layer 170 to prevent vibrations generated in the active area from escaping externally of the active area, for example. The frame layer 180 may also increase the Q factor of the bulk acoustic wave filter device 100.

As only non-limiting examples, the upper electrode 160 may be composed of or include any one of molybdenum (Mo), ruthenium (Ru), tungsten (W), iridium (Ir), and platinum (Pt), or an alloy of at least two of molybdenum (Mo), ruthenium (Ru), tungsten (W), iridium (Ir), and platinum (Pt).

Density reduction layers 190 are respectively disposed in a portion of the bulk acoustic wave filter device 100 in or on the upper electrode 160, respectively arranged outside of the central portion of the active area, noting that there may also be only a single density reduction layer 190 configured as illustrated in FIG. 1 and that bands the bulk acoustic wave filter 100, for example. In an example, the density reduction layers 190 may be formed of an oxide.

As an example, the respective density reduction layer 190 may be formed by a performed select oxidation of the upper electrode 160. For example, the density reduction layer 190 may be formed in a portion of the electrode layer 170 disposed near the frame layer 180, e.g., beyond the frame layer 180 in the direction toward the center (i.e., laterally center) of the active area while still outside of the center of the active area. As noted, the density reduction layer 190 may also have a band shape. For example, from a top perspective, the bulk acoustic wave filter device 100 may have circular, elliptical, oval, rectangular, or irregular shape, e.g., centered with the center of the active area. The frame layer 180 may be formed along the circumference of the active area, such as in a band shape, with the density reduction layer 190 being similarly formed as another band shape within the circumference of the active area.

Here, though the density reduction layer 190 has been discussed as being formed through an oxidation of a portion of the electrode layer 170, embodiments are not limited thereto, as the density reduction layer 190 may be alternatively formed by stacking the density reduction layer 190, formed of an oxide, above the electrode layer 170.

In another example, the density reduction layer 190 may be similarly vertically aligned but not exposed to a surface of the upper electrode 160.

Further, the density reduction layer 190 may not be formed of oxide, and may also be formed by stacking a material having a lower density than that of the upper electrode 160.

In other words, there may be various formation methods for the density reduction layer 190 depending on embodiment.

In an example, the density reduction layer 190 may be formed of an oxide layer such as molybdenum dioxide ($MoO_2$) or molybdenum trioxide ($MoO_3$), when the upper electrode 160 is formed of a molybdenum (Mo) material.

In addition, as only an example, the density of the density reduction layer 190 may be about ⅓ of the density of the remainder of the upper electrode 160, or the remainder of the electrode layer 170 aligned vertically with the density reduction layer 190. Further, as only examples, embodiments include forming the thickness of the density reduction layer 190 to be between several nm to several tens of nm, e.g., according to oxidation conditions.

The density reduction layer 190 may operate to suppress spurious resonances that could result from excitation of lateral waves in the active area. For example, the total thickness of the density reduction layer 190 may be less than a total thickness of a corresponding vertically aligned remainder of the active area, e.g., those portions of the active area vertically aligned below the density reduction layer 190 or merely the active area excluding the density reduction layer 190. Accordingly, in a vertical region of the bulk acoustic wave filter device 100 corresponding to the density reduction layer 190, due to the density reduction layer 190 having a total thickness less than that of the remainder of the active area or the bulk acoustic wave filter device 100 vertically aligned, for example, with the density reduction layer 190, a displacement magnitude or amplitude of the longitudinal wave may be changed more abruptly than without the density reduction layer 190 so energy is suppressed from exciting the lateral waves. For example, a natural decreasing energy distribution of the longitudinal waves that may decrease exponentially with distance away from the active area may be caused to more abruptly decrease before reaching a region vertically aligned with the frame layer 180. In addition, due to the adjustment in the displacement magnitude of the longitudinal wave, the longitudinal wave may also have an even shape across a majority of the active area.

Accordingly, with the density reduction layer 190 and induced variations in the displacement magnitude of the longitudinal wave occurring according to distances from an inner portion of the active area through the frame layer 180, spurious resonances may be suppressed. Thus, with the density reduction layer 190, the occurrence of the spurious resonances from lateral vibrations or waves in a lower frequency than a resonant frequency is suppressed.

Figure 2:
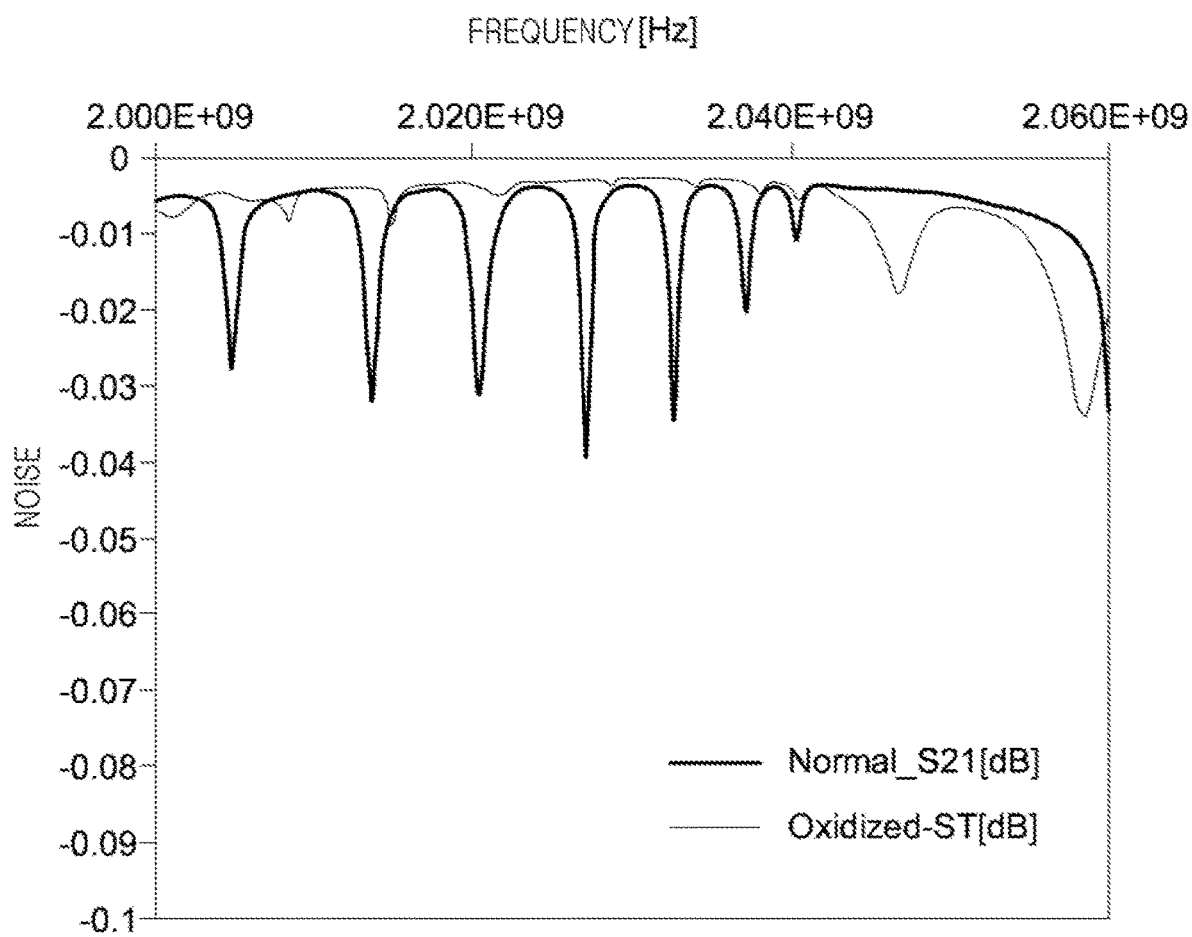
FIG. 2 is a graph illustrating an example reduction in noise by the bulk acoustic wave filter device of FIG. 1.

For example, with the density reduction layer 190, FIG. 2 demonstrates that an example of the bulk acoustic wave filter device 100 of FIG. 1 can reduce spurious resonances or noise. For example, for a configuration of a bulk acoustic wave filter without a density reduction layer 190, the noise was about 0.36 dB, while, with an example implementation of the bulk acoustic wave filter 100 of FIG. 1 with the density reduction layer 190, noise was about 0.07 dB. As described above, spurious resonances or noise are reduced, and thus, even, low insertion loss characteristics within a large pass band of the bulk acoustic wave filter device 100 having a high Q factor and coupling coefficient can be secured.

Returning to FIG. 1, the passivation layer 200 covers the frame layer 180 and the electrode layer 170. For example, the passivation layer 200 may help prevent the frame layer 180 and the electrode layer 170 from being damaged during the manufacturing process, and further, the thickness of the passivation layer 200 may be adjusted by etching, in order to control the frequency in the final produced bulk acoustic wave filter 100.

The passivation layer 200 may also be formed to cover all other portions of the bulk acoustic wave filter device 100, except portions thereof in which the respective metal pads 210 are formed.

For example, respective metal pads 210 are electrically connected to the lower electrode 140 and the upper electrode 160.

As described above, the density reduction layer 190 suppresses spurious resonance of lateral waves or vibrations. This reduces the spurious noise, and thus, the even and low insertion loss characteristics within the pass band of the bulk acoustic wave filter device 100 may be secured.

The bulk acoustic wave filter device 100 may be used as an RF filter for a front end module of a mobile communications device, for example. In such an example, a plurality of resonators are connected in series between a signal input terminal and a signal output terminal, and a plurality of resonators are connected in parallel between the resonators connected in series and a ground, thus configuring the RF filter in a lattice arrangement, for example, or in a ladder arrangement with the resonators having the configuration of the bulk acoustic wave filter device 100 with the density reduction layer 190. With such a filter, spurious resonances or noise by lateral wave resonance is suppressed, and thus, an even signal input characteristic may be provided over the whole of the pass band.

Below, example formation methods of a bulk acoustic wave filter device having a density reduction layer, such the density reduction layer 190 and bulk acoustic wave filter device 100 described above, will be briefly described. Here, though reference will be made below to the bulk acoustic wave filter device 100 discussed above with respect to FIG. 1, this is done for convenience of explanation and thus embodiments are not limited thereto, as such discussions are also applicable to other discussions herein regarding density reduction layers as well as those understood in view of the present disclosure.

Figure 3:
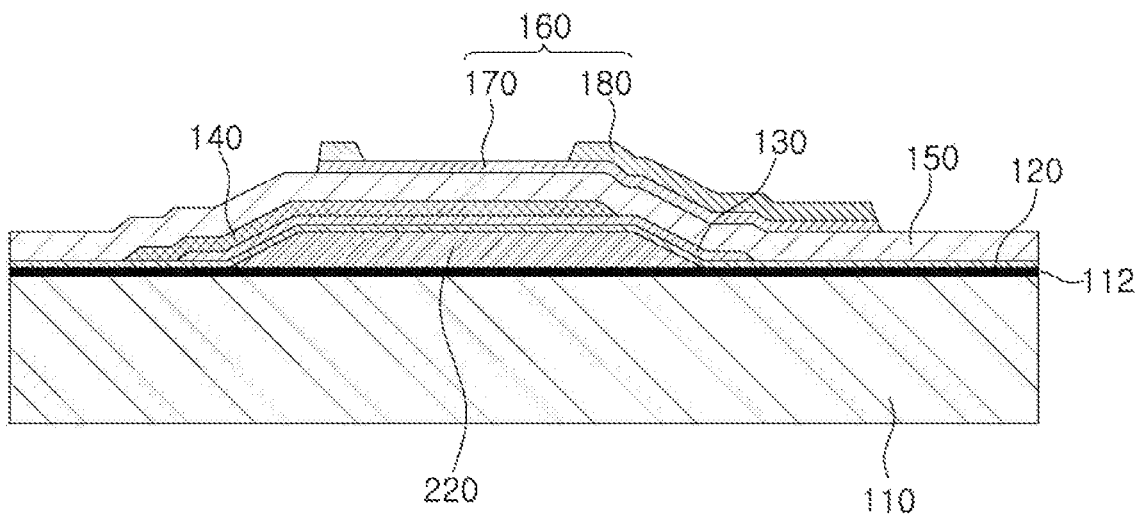
FIGS. 3 through 5 are cross-sectional views illustrating a process of forming a density reduction layer provided in a bulk acoustic wave filter device according to one or more embodiments.
Figure 4:
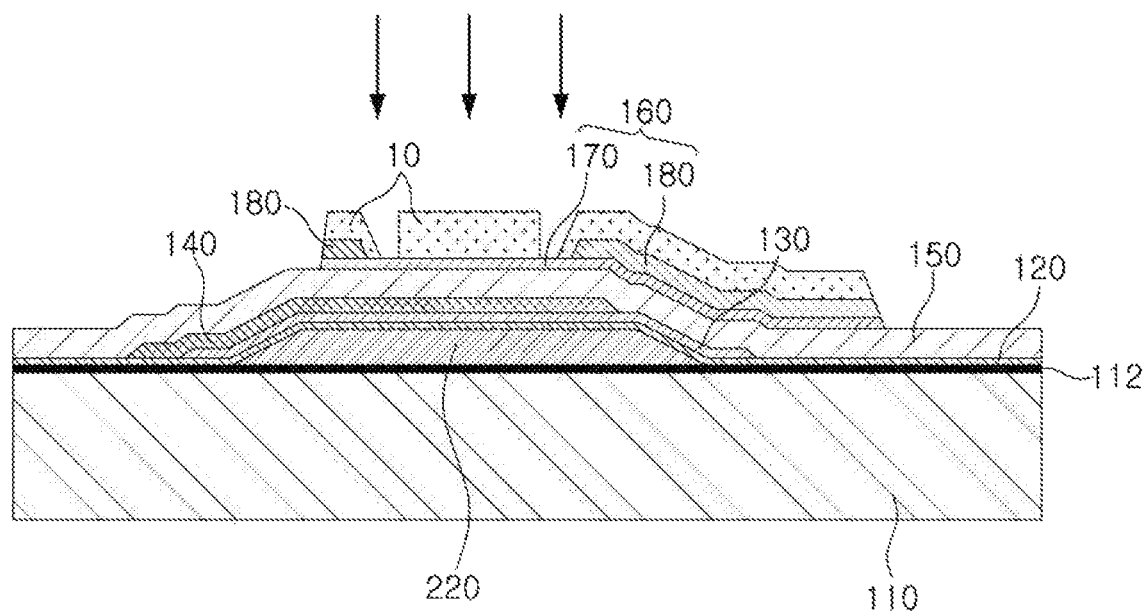
Figure 5:
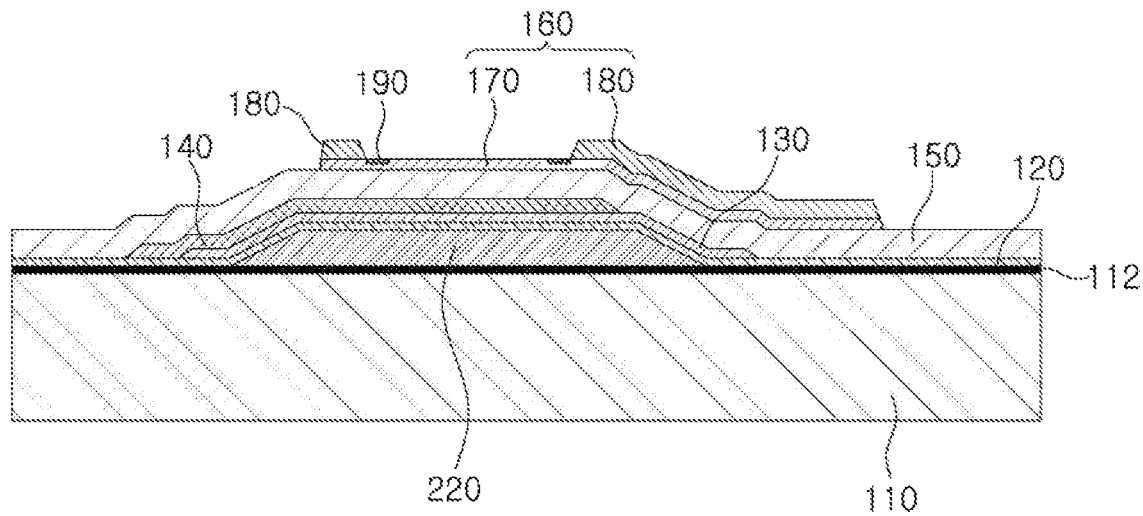

Accordingly, FIGS. 3 through 5 are cross-sectional views illustrating a process of forming a density reduction layer provided in a bulk acoustic wave filter device according to one or more embodiments.

As illustrated in FIG. 3, the sacrificial layer 220, the first layer 120, the second layer 130, the lower electrode 140, the piezoelectric layer 150, and the upper electrode 160 are sequentially stacked on the substrate 110.

As illustrated in FIG. 4, a photoresist layer 10 is stacked on the upper electrode 160. The photoresist layer 10 prevents oxidation of the central portion of the active area and the frame layer 180 during the oxidation process to form the density reduction layer. Thus, with the oxidation process, the density reduction layer 190 is formed in a portion of the bulk acoustic wave filter device 100, for example, in which the photoresist layer 10 is not formed.

For example, the density reduction layer 190 may be formed by oxidation of the electrode layer 170. In an example, the density reduction layer 190 is formed through a surface treatment through an ashing process with respect to the select portion of the electrode layer 170. For example, the density reduction layer 190 may be formed of an oxide.

As an example, the density reduction layer 190 may be formed through oxidation of the electrode layer 170 to and to have a band shape, e.g., corresponding to the circumferential shape of the active area or the internal circumference of the frame layer 180, for example.

The density reduction layer 190 may be formed of, for example, an oxide layer such as molybdenum dioxide ($MoO_2$) or molybdenum trioxide ($MoO_3$), such as when the upper electrode 160 is formed of a molybdenum (Mo) material.

The density of the density reduction layer 190 may be about ⅓ of that of the remainder of the upper electrode 160. Further, the thickness of the density reduction layer 190 may be adjusted to several nm to several tens of nm, according to oxidation conditions that depend on embodiment and corresponding varying available configurations and properties of remaining layers of the active area, for example.

As illustrated in FIG. 5, the photoresist layer 10 is removed. With the photoresist layer 10 having been removed, the density reduction layer 190, for example, a molybdenum oxide layer, has been formed on the upper electrode 160.

Herein, bulk acoustic filter devices according to examples are described with reference to the drawings. Repeated discussions will be omitted for components or features with same or like reference numbers that have not been differently described or configured, noting that descriptions for the same are applicable or available for all embodiments, as appropriate, while also noting that alternative embodiments are also available.

Figure 6:
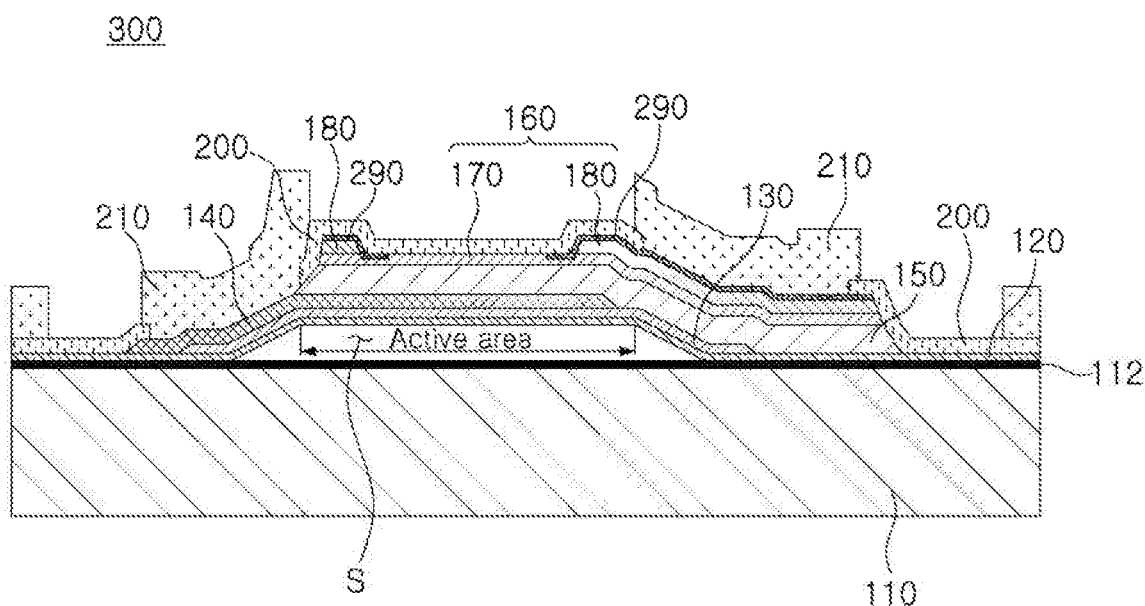
FIG. 6 is a cross-sectional view illustrating a bulk acoustic wave filter device according to one or more embodiments.

FIG. 6 is a cross-sectional view illustrating a bulk acoustic wave filter device according to one or more embodiments. Below, layers or components of the bulk acoustic wave filter device of FIG. 6 will be referred to with same reference numbers as corresponding layers or components in FIG. 6 merely for convenience of explanation, noting that embodiments are not limited to the configuration, layers, or components of FIG. 1.

Referring to FIG. 6, a bulk acoustic wave filter device 300 includes an air gap S, a substrate 110, a first layer 120, a second layer 130, a lower electrode 140, a piezoelectric layer 150, an upper electrode 160, an electrode layer 170, frame layers 180, density reduction layers 290, a passivation layer 200, and metal pads 210, for example.

The respective density reduction layer 290 may be formed on the respective frame layers 180 and also formed in or on corresponding portions of the electrode layer 170 disposed near the corresponding frame layer 180, e.g., beyond the respective frame layers 180 in the direction toward the center (i.e., laterally center) of the active area while still outside of the center of the active area. Here, it is noted that there may also be only a single density reduction layer 180 configured as illustrated in FIG. 1 and that bands the bulk acoustic wave filter 300. For example, the respective density reduction layer 290 may be formed in a portion of the bulk acoustic wave filter device 300, except a central portion of an active area of the electrode layer 170, and may be formed of an oxide.

The density reduction layer 290 may be formed by oxidation of the upper electrode 160, i.e., each of the electrode layer 170 and the frame layer 180. The density reduction layer 190 may also have a band shape.

Further, the thickness of the respective frame layer 180 may be greater than that of the electrode layer 170. For example, the frame layer 180 may have a thickness greater than a corresponding portion of the electrode layer vertically aligned with the frame layer 180.

In an example, the density reduction layer 290 may be formed of an oxide layer such as molybdenum dioxide (MoO$_2$) or molybdenum trioxide (MoO$_3$) when the upper electrode 160 is formed of a molybdenum (Mo) material, though embodiments are not limited thereto.

In addition, as only an example, the density of the density reduction layer 290 may be about ⅓ of the density of the remainder of the upper electrode 160, or the remainder of the electrode layer 170 aligned vertically with the density reduction layer 290. Further, as only examples, embodiments include forming the thickness of the density reduction layer 290 to be between several nm to several tens of nm, e.g., according to oxidation conditions.

The density reduction layer 290 may operate to suppress spurious resonances that could result from excitation of lateral waves in the active area. For example, the total thickness of the density reduction layer 290 may be less than a total thickness of a corresponding vertically aligned remainder of the active area, e.g., those portions of the active area vertically aligned below the density reduction layer 290 or merely the active area excluding the density reduction layer 290. Accordingly, in a vertical region of the bulk acoustic wave filter device 300 corresponding to the density reduction layer 290, due to the density reduction layer 190 having a total thickness less than that of the remainder of the active area or the bulk acoustic wave filter device 300 vertically aligned, for example, with the density reduction layer 290, a displacement magnitude or amplitude of the longitudinal wave may be changed more abruptly than without the density reduction layer 290 so energy is suppressed from exciting the lateral waves. For example, a natural decreasing energy distribution of the longitudinal waves that may decrease exponentially with distance away from the active area may be caused to more abruptly decrease before reaching a region vertically aligned any portion of the frame layer 180 that is not vertically aligned with the density reduction layer 290 or portions of the bulk acoustic wave filter device 300 after the frame layer 180. In addition, due to the adjustment in the displacement magnitude of the longitudinal wave, the longitudinal wave may also have an even shape across a majority of the active area.

Accordingly, with the density reduction layer 290 and induced variations in the displacement magnitude of the longitudinal wave occurring according to distances from an inner portion of the active area through the frame layer 180, spurious resonances from lateral waves may be suppressed. Thus, with the density reduction layer 290, the occurrence of the spurious resonances from lateral vibrations or waves in a lower frequency than a resonant frequency is suppressed.

Figure 7:
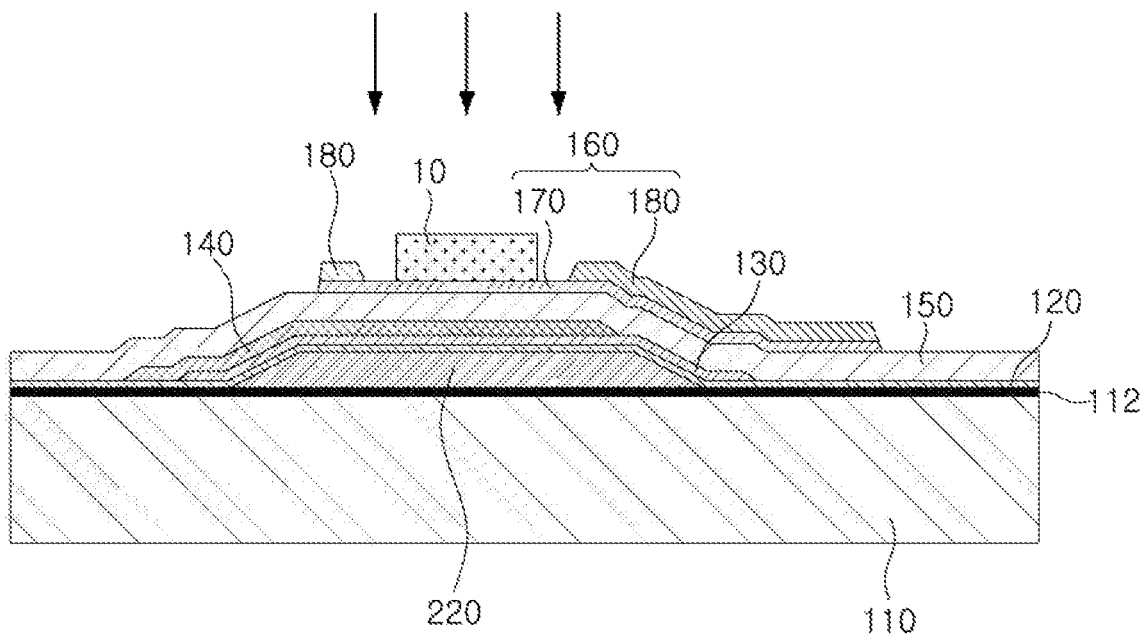
FIG. 7 is a cross-sectional view illustrating a process of forming a density reduction layer provided in a bulk acoustic wave filter device according to one or more embodiments.

FIG. 7 is a cross-sectional view illustrating a process of forming a density reduction layer provided in a bulk acoustic wave filter device according to one or more embodiments. Here, though reference will be made below to the bulk acoustic wave filter device 300 discussed above with respect to FIG. 6, this is done for convenience of explanation and thus embodiments are not limited thereto, as such discussions are also applicable to other discussions herein regarding density reduction layers as well as those understood in view of the present disclosure.

As illustrated in FIG. 7, the photoresist layer 10 may be stacked on the upper electrode 160. The photoresist layer 10 prevents oxidation of the electrode layer 170 disposed in the central portion of the active area during the oxidation process to form the density reduction layer. Thus, with the oxidation process, the density reduction layer 290 is formed in a portion of the bulk acoustic wave filter device 300, for example, in which the photoresist layer 10 is not formed.

For example, the density reduction layer 290 may be formed by oxidation of the electrode layer 170 and the frame layer 180. In an example, the density reduction layer 290 is formed through a surface treatment through an ashing process with respect to the corresponding select portion of the electrode layer 170 and a select portion or the entire width of the frame layer 180. For example, the density reduction layer 290 may be formed of an oxide. For example, when the electrode layer 170 and frame layer 180 are both made of molybdenum, the entirety of the density reduction layer 290 may be a molybdenum oxide layer formed on the upper electrode 160.

When the photoresist layer 10 is removed, the passivation layer 200, for example, may be formed on the upper electrode 160, the frame layer 180, and the density reduction layer 290.

Figure 8:
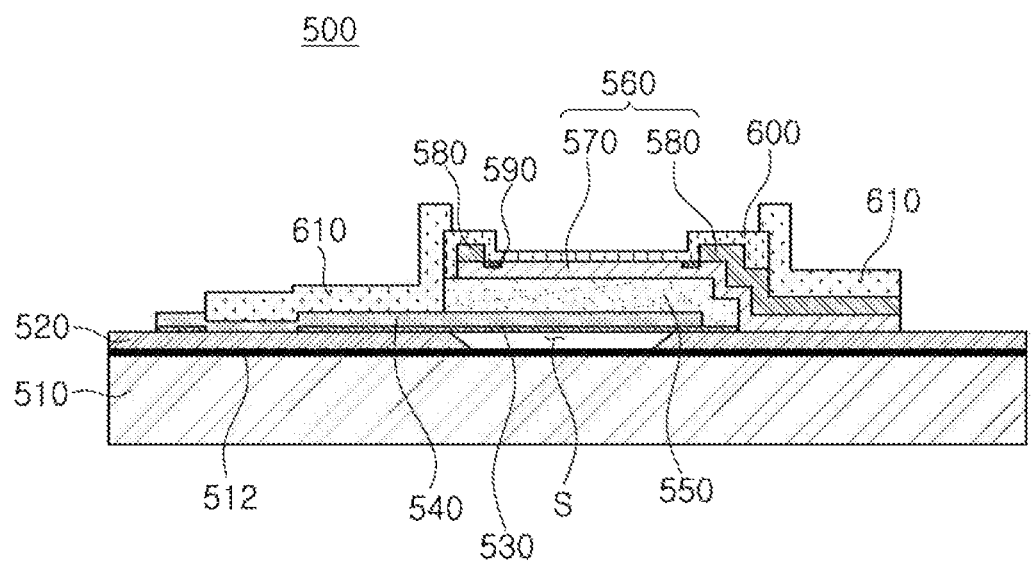
FIG. 8 is a cross-sectional view illustrating a bulk acoustic wave filter device according to one or more embodiments.

FIG. 8 is a cross-sectional view illustrating a bulk acoustic wave filter device according to one or more embodiments.

Referring to FIG. 8, the bulk acoustic wave filter device 500 according to the third example includes an air gap S, a substrate 510, an air gap formation layer 520, a first protection layer 530, a lower electrode 540, a piezoelectric layer 550, an upper electrode 560, an electrode layer 570, frame layers 580, density reduction layers 590, a passivation layer 600, and metal pads 610, for example.

The substrate 510 may be a substrate on which silicon (Si) is laminated, for example. In an example, a silicon wafer may be used as the substrate. A protection layer 512 may also be formed on an upper surface of the substrate 510, such as to protect the silicon during a removal process of a sacrificial layer, which may be used to form the air gap S, for example. For example, the protection layer 512 may prevent etching of the substrate 510 during such a removal process.

The air gap formation layer 520 is formed on the substrate 510, and a recessed portion may be formed in the air gap formation layer 520, demonstrated by the area between the respective tapered sides of the air gap formation layer 520. Here, the formation of the recessed portion may produce such tapering in the air gap formation layer 520. For example, the sacrificial layer may be formed in the recessed portion of the air gap formation layer 520 and then the sacrificial layer may be removed, e.g., by etching, after the first protection layer 530 is formed over the recessed portion, and the air gap S may thus be formed.

As described above, the air gap S is formed in the air gap formation layer 520, and thus, other components formed on the air gap formation layer 520 may have flat shapes. Likewise, the first protection layer 530 may also have a flat shape, and thus, other components formed on the first protection layer 530 may also have flat shapes.

As only an example, the first protection layer 530 may be formed of silicon oxide ($SiO_2$) or a material containing the same. The first protection layer 530 may also help prevent etching of a lower side portion of the lower electrode 540 during the example removal process of the sacrificial layer.

The lower electrode 540 is formed on the first protection layer 530. As only an example, the lower electrode 540 may be formed using a conductive material such as molybdenum (Mo), ruthenium (Ru), tungsten (W), iridium (Ir), or platinum (Pt), or alloys thereof.

The lower electrode 540 may also be used as an input electrode inputting an electrical signal such as an RF signal to the piezoelectric layer 550 or an output electrode. For example, when the lower electrode 540 is the input electrode, the upper electrode 560 may be the output electrode, and when the lower electrode 540 is the output electrode, the upper electrode 560 may be the input electrode.

The piezoelectric layer 550 covers at least a portion of the lower electrode 540. The piezoelectric layer 550 also converts the electrical signal input from the lower electrode 540 or the upper electrode 560 into acoustic waves.

As an example, when an electric field that changes over time is induced in the upper electrode 560, the piezoelectric layer 550 may convert the electrical signal input from the upper electrode 560 into physical vibrations which manifest as acoustic waves in an active area of the bulk wave acoustic filter 500. Accordingly, it can be considered that changes in the electric field over time by the upper electrode 560 may be induced by the piezoelectric layer 550 as primarily in the thickness direction (illustrated vertical direction) longitudinal acoustic waves. At the transition between the lower electrode 540 and the piezoelectric layer 550, the acoustic waves are converted by the piezoelectric layer 550 to corresponding electric field changes at the lower electrode 540. Here, the piezoelectric layer 550 generates bulk acoustic longitudinal waves in the thickness direction of the piezoelectric layer 550 in the piezoelectric layer 550, due to the induced electric field.

The piezoelectric layer 550 is formed of, e.g., by depositing, aluminum nitride, zinc oxide, or lead zirconate titanate on the lower electrode 540.

The upper electrode 560 covers at least a portion of the piezoelectric layer 550. As an example, the upper electrode 560 may have an electrode layer 570 covering the piezoelectric layer 550, and have the frame layers 580 formed on the electrode layer 570.

The thickness of each of the frame layers 580 may be greater than that of the electrode layer 570, noting that there may also be only a single frame layer 580 configured as illustrated in FIG. 8 and that bands the bulk acoustic wave filter 500. The respective frame layer 580 is formed on the electrode layer 570 so as to be disposed in a portion of the bulk acoustic wave filter device 500 outside of a central portion of the active area. In other words, the frame layer 580 is configured in the portion of the bulk acoustic wave filter device 500 so that at least both a portion of the frame layer 580 and a portion of the electrode layer 570 are externally disposed during a manufacturing process of the bulk acoustic wave filter device 500.

As an example, the frame layer 580 may be formed of the same material as the electrode layer 570. However, the frame layer 580 is not limited thereto, and may be formed of a material different from that of the electrode layer 570.

The frame layer 580 reflects lateral waves that may be generated at the time of resonance to an inner portion of the active area, thus trapping resonant energy in the active area. In other words, the frame layer 580 is formed on an outer portion of the electrode layer 570, to prevent vibrations generated in the active area from escaping externally of the active area, for example. The frame layer 580 may also increase the Q factor of the bulk acoustic wave filter device 500.

As only non-limiting examples, the upper electrode 560 may include any one of molybdenum (Mo), ruthenium (Ru), tungsten (W), iridium (Ir), and platinum (Pt), or an alloy of at least two of molybdenum (Mo), ruthenium (Ru), tungsten (W), iridium (Ir), and platinum (Pt).

In or on the upper electrode 560 there are density reduction layers 590 respectively disposed in a portion of the bulk acoustic wave filter device 500, arranged outside of the central portion of the active area that deforms and vibrates along with the piezoelectric layer 550 when the piezoelectric layer 550 deforms. For example, the density reduction layers 590 may be formed of an oxide.

As an example, the density reduction layers 590 may be formed by a performed select oxidation of the upper electrode 560, noting that there may also be only a single density reduction layer 590 configured as illustrated in FIG. 8 and that bands the bulk acoustic wave filter 500. For example, the respective density reduction layer 590 may be formed in a portion of the electrode layer 570 disposed near the frame layer 580, e.g., beyond the frame layer 580 in the direction toward the center (i.e., laterally center) of the active area while still outside of the center of the active area. As noted, the density reduction layer 590 may also have a band shape. For example, from a top perspective, the bulk acoustic wave filter device 500 may have circular, elliptical, oval, rectangular, or irregular shape, e.g., centered with the center of the active area. The frame layer 580 may be formed along the circumference of the active area, such as in a band shape, with the density reduction layer 590 being similarly formed as another band shape within the circumference of the active area.

However, similar to above, the density reduction layer 590 is not limited to a case in which the density reduction layer 590 is formed in the above-mentioned manner, and may be formed by various formation methods, such as by stacking the density reduction layer 590 formed of oxide on the electrode layer 570.

In an example, the density reduction layer 590 may be formed of an oxide layer such as molybdenum dioxide ($MoO_2$) or molybdenum trioxide ($MoO_3$) when the upper electrode 560 is formed of a molybdenum (Mo) material.

In addition, as only an example, the density of the density reduction layer 590 may be about ⅓ of the density of the remainder of the upper electrode 560, or the remainder of the electrode layer 570 aligned vertically with the density reduction layer 590. Further, as only examples, embodiments include forming the thickness of the density reduction layer 590 to be between several nm to several tens of nm, e.g., according to oxidation conditions.

The density reduction layer 590 may operate to suppress spurious resonances that could result from excitation of lateral waves in the active area. For example, the total thickness of the density reduction layer 590 may be less than a total thickness of a corresponding vertically aligned remainder of the active area, e.g., those portions of the active area vertically aligned below the density reduction layer 590 or merely the active area excluding the density reduction layer 590. Accordingly, in a vertical region of the bulk acoustic wave filter device 500 corresponding to the density reduction layer 590, due to the density reduction layer 590 having a total thickness less than that of the remainder of the active area or the bulk acoustic wave filter device 500 vertically aligned, for example, with the density reduction layer 590, a displacement magnitude or amplitude of the longitudinal wave may be changed more abruptly than without the density reduction layer 590 so energy is suppressed from exciting the lateral waves. For example, a natural decreasing energy distribution of the longitudinal waves that may decrease exponentially with distance away from the active area may be caused to more abruptly decrease before reaching a region vertically aligned with the frame layer 580. In addition, due to the adjustment in the displacement magnitude of the longitudinal wave, the longitudinal wave may also have an even shape across a majority of the active area.

Accordingly, with the density reduction layer 590 and induced variations in the displacement magnitude of the longitudinal wave occurring according to distances from an inner portion of the active area through the frame layer 580, spurious resonances from lateral waves may be suppressed.

Thus, with the density reduction layer 590, the occurrence of the spurious resonances from lateral vibrations or waves in a lower frequency than a resonant frequency is suppressed.

The passivation layer 600 covers the frame layer 580 and the electrode layer 570. For example, the passivation layer 600 may help prevent the frame layer 580 and the electrode layer 570 from being damaged during the manufacturing process, and, further, the thickness of the passivation layer 600 may be adjusted by etching, in order to control the frequency in the final process to generate the bulk acoustic wave filter 500 with a set resonant frequency, for example.

The passivation layer 600 may also be formed to cover all other portions of the bulk acoustic wave filter device 500, except portions thereof in which the respective metal pads 610 are formed.

For example, the respective metal pads 610 are electrically connected to the lower electrode 540 and the upper electrode 560.

As described above, the density reduction layer 590 suppresses spurious resonances of lateral waves or vibrations. This reduces the spurious noise, and thus, the even and low insertion loss characteristics within the pass band of the bulk acoustic wave filter device 500 may be secured.

As only an example, the bulk acoustic wave filter device 500 may be used as the RF filter for a front end module of the mobile communications device. For example, a plurality of resonators are connected in series between a signal input terminal and a signal output terminal, and a plurality of resonators are connected in parallel between the resonators connected in series and a ground, thus configuring the RF filter in a lattice arrangement, for example, or in a ladder arrangement with the resonators having the configuration of the bulk acoustic wave filter device 500 with the density reduction layer 590.

Accordingly, in examples, spurious resonances and noise by lateral waves, for example, may be suppressed, and thus, even signal input characteristics over the whole of the pass band may be provided. In addition, an increased Q Factor and coupling coefficient may also be provided.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave filter device comprising:
 a substrate;
 a lower electrode disposed on the substrate;
 a piezoelectric layer covering at least a portion of the lower electrode; and
 an upper electrode covering at least a portion of the piezoelectric layer,
 wherein the upper electrode has a density reduction layer disposed on at least a portion of the upper electrode, adjacent to a central portion of a resonance region of the bulk acoustic wave filter device that deforms and vibrates with the piezoelectric during activation of the piezoelectric layer, the density reduction layer having a density lower than a density of other portions of the upper electrode, and
 wherein the upper electrode has an electrode layer covering the piezoelectric layer and a frame layer stacked on the electrode layer.

2. The bulk acoustic wave filter device of claim 1, wherein the density reduction layer includes an oxide.

3. The bulk acoustic wave filter device of claim 2, wherein the upper electrode includes a conductor, and wherein the density reduction layer is a result of a select oxidation of the conductor of the upper electrode.

4. The bulk acoustic wave filter device of claim 2, wherein the density reduction layer is formed on a portion of the electrode layer disposed between the frame layer and an inner area of the electrode layer corresponding to the resonance region.

5. The bulk acoustic wave filter device of claim 4, wherein the density reduction layer formed on the portion of the electrode layer has a band shape outside a circumference of the inner area and inside an inner circumference of the frame layer.

6. The bulk acoustic wave filter device of claim 4, wherein the frame layer has a thickness that is greater than a thickness of the electrode layer.

7. The bulk acoustic wave filter device of claim 1, further comprising:
a first layer forming an air gap together with the substrate; and
a second layer formed on the first layer so as to be disposed on the air gap below the lower electrode.

8. The bulk acoustic wave filter device of claim 1, further comprising:
a first metal pad formed on the upper electrode and a second metal pad formed on the lower electrode; and
a passivation layer formed in all portions of the bulk acoustic wave filter, except portions of the bulk acoustic wave filter in which the metal pads are formed.

9. The bulk acoustic wave filter device of claim 1, wherein the upper electrode includes any one of molybdenum (Mo), ruthenium (Ru), tungsten (W), iridium (Ir), and platinum (Pt), or an alloy of at least two of molybdenum (Mo), ruthenium (Ru), tungsten (W), iridium (Ir), and platinum (Pt).

10. The bulk acoustic wave filter device of claim 1, further comprising:
an air gap formation layer formed on the substrate, the air gap formation layer having an air gap therein; and
a first protection layer formed on the air gap formation layer and disposed below the lower electrode.

11. A bulk acoustic wave filter device comprising:
a substrate;
a lower electrode disposed on the substrate;
a piezoelectric layer covering at least a portion of the lower electrode; and
an upper electrode covering at least a portion of the piezoelectric layer,
wherein the upper electrode has a density reduction layer disposed on at least a portion of the upper electrode, adjacent to a central portion of a resonance region of the bulk acoustic wave filter device that deforms and vibrates with the piezoelectric during activation of the piezoelectric layer, the density reduction layer having a density lower than a density of other portions of the upper electrode;
wherein the upper electrode has an electrode layer covering the piezoelectric layer and a frame layer stacked on the electrode layer, and
wherein the density reduction layer is formed on the frame layer and between the frame layer and an inner area of the electrode layer.

12. The bulk acoustic wave filter device of claim 11, wherein the frame layer has a band shape outside a circumference of the inner area.

13. A film bulk acoustic wave resonator comprising:
a substrate including or supporting a cavity;
a first electrode disposed above the cavity;
a piezoelectric layer disposed above the cavity;
a second electrode disposed above the cavity;
a frame disposed above the first electrode at an outer circumference of a resonance region represented by at least a portion of the first electrode, a portion of the piezoelectric layer, and a portion of the second electrode; and
a low density element disposed above the first electrode within an inner circumference of the frame and outside of an inner region of the resonance region,
wherein the frame and the low density element are configured to suppress spurious resonances other than a longitudinal resonance produced in the resonance region.

14. The film bulk acoustic wave resonator of claim 13, wherein the low density element is configured to suppress lateral wave excitation in the resonance region.

15. The film bulk acoustic wave resonator of claim 13, wherein the low density element has a density less than a density of the first electrode.

16. The film bulk acoustic wave resonator of claim 15, wherein the low density element is an oxide of a conductor of the first electrode, and is formed from the first electrode.

17. The film bulk acoustic wave resonator of claim 13, wherein the piezoelectric includes Aluminum nitride (AlN), the piezoelectric layer further include at least one of scandium (Sc), erbium (Er), yttrium (Y), and lanthanum (La).

18. A film bulk acoustic wave resonator comprising:
a substrate including or supporting a cavity;
a first electrode disposed above the cavity;
a piezoelectric layer disposed above the cavity;
a second electrode disposed above the cavity; and
a low density element disposed above the first electrode, and arranged with respect to a circumference of a resonance region, represented by at least a portion of the first electrode, a portion of the piezoelectric layer, a portion of the second electrode, and outside of an inner region of the resonance region,
wherein the low density element is configured to suppress lateral wave excitation in the resonance region, and
wherein the low density element is an oxide of a conductor of the first electrode, and is formed from the first electrode to have a density lower than a density of the conductor.

19. The film bulk acoustic wave resonator of claim 18, wherein the low density element has a density less than a density of the first electrode.

20. The film bulk acoustic wave resonator of claim 19, where the low density element has a thickness less than a total remaining aligned thickness of the resonance region and greater than a thickness of the electrode layer.

21. The film bulk acoustic wave resonator of claim 18, wherein the cavity is formed between portions of a gap formation layer formed on the substrate, so as to be formed above the substrate.

* * * * *